United States Patent

[11] 3,617,045

[72] Inventors Harry Da Costa
Scottsdale;
Charles G. Thornton, Phoenix, both of Ariz.
[21] Appl. No. 2,881
[22] Filed Jan. 14, 1970
[45] Patented Nov. 2, 1971
[73] Assignee Motorola, Inc.
Franklin Park, Ill.

[54] VACUUM-ACTUATED CHUCK
4 Claims, 4 Drawing Figs.

[52] U.S. Cl. ........ 269/21, 248/363, 279/3
[51] Int. Cl. ........ B25b 11/00
[50] Field of Search ........ 279/3; 269/21; 51/235; 248/362, 363

[56] References Cited

UNITED STATES PATENTS 3,272,350 9/1966 Pflaumer et al. ........ 279/3 X
3,299,502 1/1967 Wanesky ........ 269/21 X
3,475,097 10/1969 Bishop et al. ........ 269/21 X

*Primary Examiner*—William S. Lawson
*Assistant Examiner*—James F. Coan
*Attorney*—Mueller, Aichele & Rauner

ABSTRACT: A vacuum-actuated chuck is disclosed for a delicate ceramic package, such as those used for an integrated circuit, in which the package is held firmly in position while the package leads are electrically connected to the bonding pads on the integrated circuit or chip, without, however, distorting the leads extending from the package and without injuring or damaging the package. The chuck comprises a base member having a cavity including support pads for positioning the package and a space for receiving the package leads as well as an additional space for holding a support plate in position. A resilient mat which is impervious to air and which has a hole through the middle portion thereof, fits over the plate and the edge portions of the base member and the edge portions of the package. The hole in the mat exposes the inner ends of the package leads and the bonding pads on the chip so that work may be done thereon.

PATENTED NOV 2 1971 3,617,045

INVENTOR.
Harry da Costa
Charles G. Thornton
BY
Mueller, Aichele & Rauner
ATTY'S.

VACUUM-ACTUATED CHUCK

BACKGROUND

When an integrated circuit or chip is packaged, the package leads which extend out of the package must be connected as by individual wires to respective bonding pads on the chip. A convenient way of bonding the inner ends of the leads to the bonding pads is ultrasonic bonding. A lead wire is positioned over the inner end of a package lead and the tip of the wire is pressed down into intimate contact with it by a wedge-shaped needle. The needle is then vibrated ultrasonically whereby the wire is bonded to the inner end of the package leads. Then the needle is moved to a bonding pad on the chip, the lead wire being fed to remain under the needle tip. The needle is then pressed down on the bonding pad and vibrated to cause a bond between the lead wire and the bonding pad. The wire is then broken or cut between the second-mentioned bond and the needle, leaving a short tail leading out beyond the end of the needle, and then the process is repeated to electrically connect another package lead to another bonding pad. The package must be held firmly during the bonding process, since if the package were held loosely while the needle is vibrated, the package would also move, thereby resulting in poor, nonuniform bonds, or in the extreme case, resulting in no bonds at all. If a known vise is used to hold the package, the nonuniform or excessive pressure applied to the package by the known vise may damage or destroy the package. Even if slight damage to the package is inflicted thereon, it may be impossible to hermetically close the package after the bonding operation is completed. Another known way to hold the package for the bonding operation is to glue or solder it to a metallic support. When the bonding operation is over, the package must be unglued or unsoldered from the support and must be cleaned and washed which takes time and adds to the cost of the finished product.

It is an object of this invention to provide an improved clamp or chuck for holding a package while further operations such as lead bonding are preformed on the package and chip.

SUMMARY

In accordance with this invention, a chuck base member is provided having a cavity which fits the bottom portion of a package. The bottom of the cavity may be provided with three support pads to support the bottom of the package in a fixed plane. A shallow cavity which surrounds the package-fitting cavity is provided to receive the leads for the package. A pressure plate is provided, the pressure plate having a hole therein which fits the body of the package but not the leads. If desired, a shallower cavity surrounds the lead-receiving cavity to receive the pressure plate. A resilient mat of material which is impervious to air and which has a hole therethrough is provided whose outside dimensions are greater than the outside dimensions of the support plate. The inner edges of the mat surrounding the hole extend over a portion of the upper margin of the body of the package. However, the hole in the mat is large enough so that the wire-bonding operation can be performed. When suction is applied to the cavity, the package, the support plate, and the mat being in place, the package is held firmly enough so that the bonding operation can be performed efficiently. The support plate prevents collapse of the rubber mat on the leads of the package when suction is applied to the chuck. The resilient mat overlaps the margin of the support plate and base member and extends sufficiently over the top of the package to prevent air leakage into the suction chuck.

DESCRIPTION

The invention will be better understood upon reading the following description in connection with the accompanying drawing in which.

Figure 1:
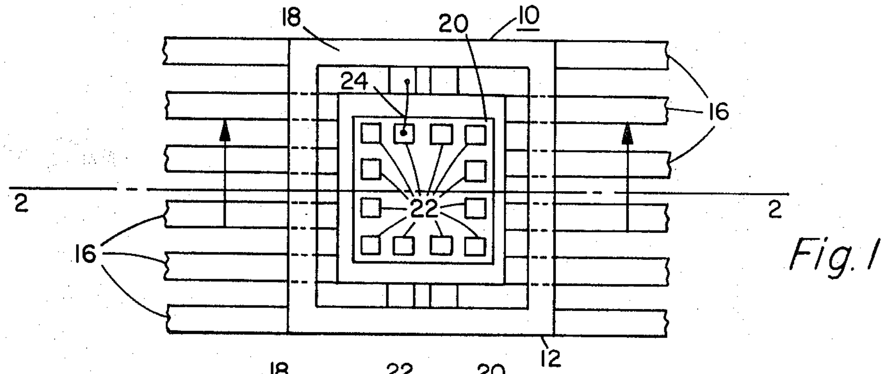
FIG. 1 is a diagrammatic view of a package that can be held firmly though without doing damage thereto by the chuck to be described.
Figure 2:
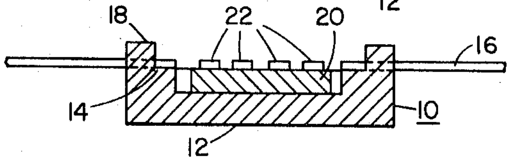
FIG. 2 is a section of the package on the line 2—2 of FIG. 1.
Figure 3:
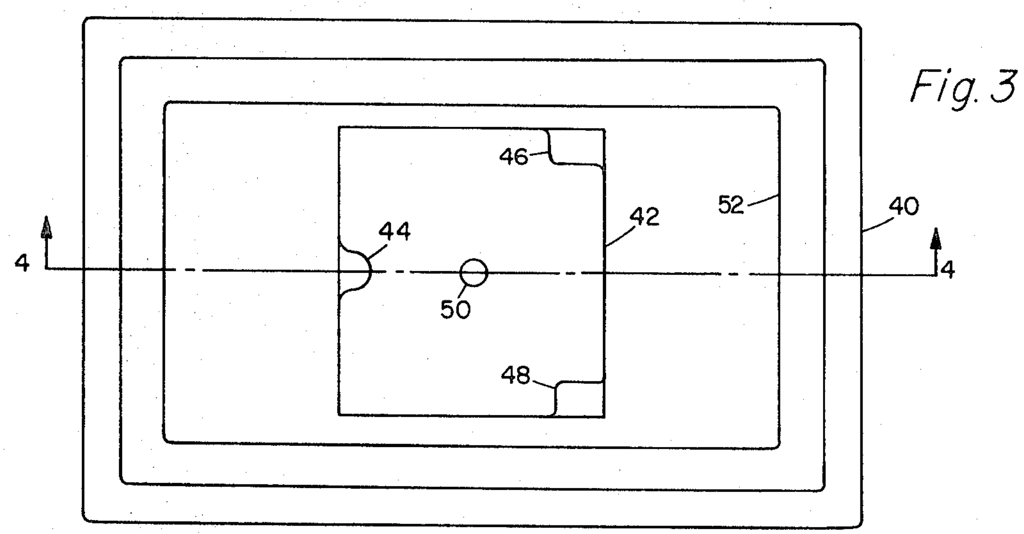
FIG. 3 is a top view of the base member comprising a part of the chuck of this invention.
Figure 4:
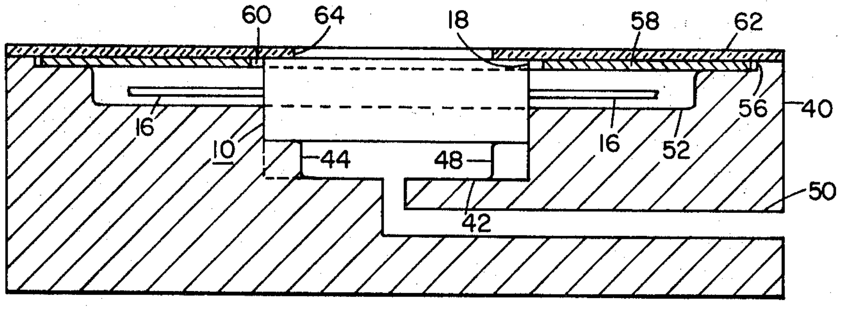
FIG. 4 is a central section of the chuck of this invention taken on the line 4—4 of FIG. 3 including, however, the support plate and the resilient mat which comprise pat of the invention chuck as well as a package to be held thereby.

Turning first to FIGS. 1 and 2, the package 10 shown therein comprises a ceramic or glasslike base portion 12 having a shelf 14 extending around the upper surface of the base portion 12. Leads 16, here shown as 12 in number, although there may be as many as may be desired, extend from opposite sides of the package 10 at the level of the top of the shelf 14. A rim 18 extends around the periphery of the shelf at 16, the rim 18 being narrower than the shelf 14, whereby the upper surface of the inner ends of the leads 16, which rest on the shelf 14, is exposed. A chip 20 is fixed, as by gluing, to the central portion of the base portion 12. The top of the chip 20 is abut at the level with the top of the shelf 14 and the tops of the bonding pads 22 (also 12 in number, although the number will usually be the same as the number of leads) of the chip are at about the same level with the top of the leads 16. Each lead 16 is to be connected to a respective pad as by a lead wire 24 (FIG. 1) by the ultrasonic method mentioned, whereby the package must be prevented from moving. Since the package is ceramic, it is easily broken or damaged. When all the electrical connections are made by providing the required number of lead wires 24, the package is hermetically sealed by applying a plate (not shown) to the top of the package in contact with the rim 18. If the edge of the rim is damaged by the holding thereof during the wiring process, it may be impossible to produce a hermetically sealed package. A chuck for holding the package 10 while it is open during the wiring thereof and which will not damage the package, is illustrated in FIGS. 3 and 4.

The base member 40 (see FIGS. 3 and 4) of the chuck to be described comprises a central cavity 42 of a size to fit the base portion 12 of the package 10. Support pads 44, 46, and 48 extend from the bottom and sides of the cavity 42. The pad 44, for example, may extend from the middle of one side of the cavity 42 while the pads 46 and 48 extend from remote corners of the cavity 42 with respect to the pad 44. The tops of the pads 44, 46, and 48 are at the same level whereby, when the package 44 rests thereon, the package 10 is firmly supported above the bottom of the cavity 42. The cavity 42 is connected to the outside of the base member 40 by a tubular opening 50 for the application of vacuum thereto.

A cavity 52 of lesser depth than the cavity 42 surrounds the cavity 52. The depth of the cavity 52 is such that the leads 16 of the package are contained in the cavity 52 without any part of the leads being bent or damaged by contact with the floor of the cavity 52. The depth of the cavity 52 may be such that no part of the leads 16 contact the floor of the cavity 52. The extent of the cavity 52 is to provide ample space for the leads 16. A cavity 56 of still less depth surrounds the cavity 52. The depth of the cavity 56 is great enough so that a support plate 58 fits therein with the top of the support plate 58 at a level with the top of the base member 40, whereby the edges of the plate 58 are supported by the floor of the cavity 56. The tops of the pads 44, 46, and 48 are at a level, whereby the top of the rim 18 of the package 10 is also at the level with the top of the member 40. A hole 60 is provided in the plate 58 to receive the rim portion 18 of the package 10. A resilient mat 62 of material that is impervious to air, such as rubber, for example, is provided. The size of the mat 62 is such as to overlap the edges of the plate 58 and to rest on the top of the member 40. A hole 64 is provided in the mat 62. The size of the hole 64 is such that the inner edges of the mat 62 overlap the outer edge of the rim 18 and cover at least a major portion of the upper surface of the rim 18. The mat 62 also overlaps the top of the member 40 surrounding the plate 58. If desired, the cavity 56 may be omitted, in which case the plate 58 rests on the member 40 and the mat 62 is formed to contact the top of the member 40 surrounding the plate 58.

When the package 10 has been placed in the base portion 40 and the plate 58 and the mat 62 are in place, upon application of vacuum to the tube 50, leakage of air into the cavity 42 is prevented by the mat 62 covering the margin of the plate 56 and the member 40 and also by covering the margin of the plate 58 and the rim 18 of the package 10. The package 10 is held firmly in place with respect to the base member 40 by the force applied to the package 10 by the vacuum produced in the chamber 42. The outer ends of the leads 16 have no force applied thereto since the plate 58 supports the mat 68 in its flat position as shown over substantially the complete extent of the leads 16. The inner ends of the leads 16 and the bonding pads 22 are fully exposed for the purpose of bonding the leads 16 to the pads 22 as by lead wires 24, only one of which is shown. The rubber mat 62 applies force uniformly to the rim 18, whereby the mat 62 does not damage the rim 18 of the package 10, but, in fact, the mat 62 protects the rim 18 of the package 10. The three-point support for the package 10 and the uniform force applied to the rim 18 thereof, prevents damage of any kind from happening to the package 10 while lead wires 24 are being applied thereto.

While the rubber mat 62 and the plate 58 may be separate items, for convenience they may be fixed together in the relative positions shown in FIG. 4 and described. In that manner, a less number of separate parts need be moved when the chuck is being set up and also the proper spacial relationship of the mat 62 and the plate 58 may be preserved.

What is claimed is:

1. A vacuum chuck comprising a base member having a first cavity therein of the form to hold a portion of an object having a rim and on which work is to be done, said base member also including a passageway for applying vacuum to said cavity, there being a second cavity in said base member surrounding said first cavity for receiving laterally extending parts of said object that do not fit in said first cavity, a pressure plate having a hole therein which is large enough to clear another portion of said object and is positionable on said base member to cover at least a portion of said cavity, and a resilient mat of material which is impervious to air flow, having a hole therein which is smaller than the hole through said plate and positionable upon said plate with said hole approximately centrally located with respect to said first cavity, the inner portions of said mat being adapted to rest on a rim portion of said object.

2. The invention of claim 1 in which three pads are provided at the bottom of said cavity, the tops of said pads being in a plane.

3. The invention of claim 2 in which a third cavity is provided in said base member and surrounding said second cavity and shaped to receive said pressure plate.

4. The invention of claim 1 in which said second cavity is greater in lateral extent and is shallower than said first cavity.